United States Patent [19]

Corbett

[11] Patent Number: 4,868,903
[45] Date of Patent: Sep. 19, 1989

[54] SAFE LOGIC ZERO AND ONE SUPPLY FOR CMOS INTEGRATED CIRCUITS

[75] Inventor: Peter F. Corbett, Princeton, N.J.

[73] Assignee: General Electric Company, Schenectady, N.Y.

[21] Appl. No.: 181,900

[22] Filed: Apr. 15, 1988

[51] Int. Cl.[4] .................. H03K 3/01; H03K 17/16; H03K 19/094

[52] U.S. Cl. ..................... 307/296.6; 307/296.8; 307/443; 307/448; 307/451; 307/491; 361/58; 361/91; 361/111

[58] Field of Search ............... 307/443, 448, 451, 491, 307/296 R, 297; 361/58, 91, 111

[56] References Cited

U.S. PATENT DOCUMENTS

| | | | |
|---|---|---|---|
| 3,638,039 | 1/1972 | Chen et al. | 307/270 |
| 4,595,941 | 6/1986 | Avery | 361/91 |
| 4,616,172 | 10/1986 | Rahim | 307/296 R |

OTHER PUBLICATIONS

"CMOS Supply Sequence Circuit", *IBM Technical Disclosure Bulletin*, vol. 29, No. 1, Jun. 1986, pp. 221–222.

"Transient Protection With Parasitic SCRs", *Electronic Product Design*, vol. 6, No. 4, Apr. 1985, pp. 93–95.

*Primary Examiner*—Stanley D. Miller
*Assistant Examiner*—Margaret R. Wambach
*Attorney, Agent, or Firm*—Marvin Snyder; James C. Davis, Jr.

[57] ABSTRACT

A circuit for supplying safe logic zero and logic one signals to hardwired inputs of CMOS ICs comprises, at most, three field effect transistors, none of which have gates connected to either drain voltage $V_{dd}$ or source voltage $V_{ss}$. The circuit has no external inputs and has two outputs, logic zero and logic one. The circuit has only one stable operating point and moves to this operating point from any initial condition. The circuit is safe and can enhance the reliability of ICs as it provides the same noise protection from voltages $V_{ss}$ and $V_{dd}$ for nodes connected to its output that an inverter provides for nodes connected to its output.

6 Claims, 1 Drawing Sheet

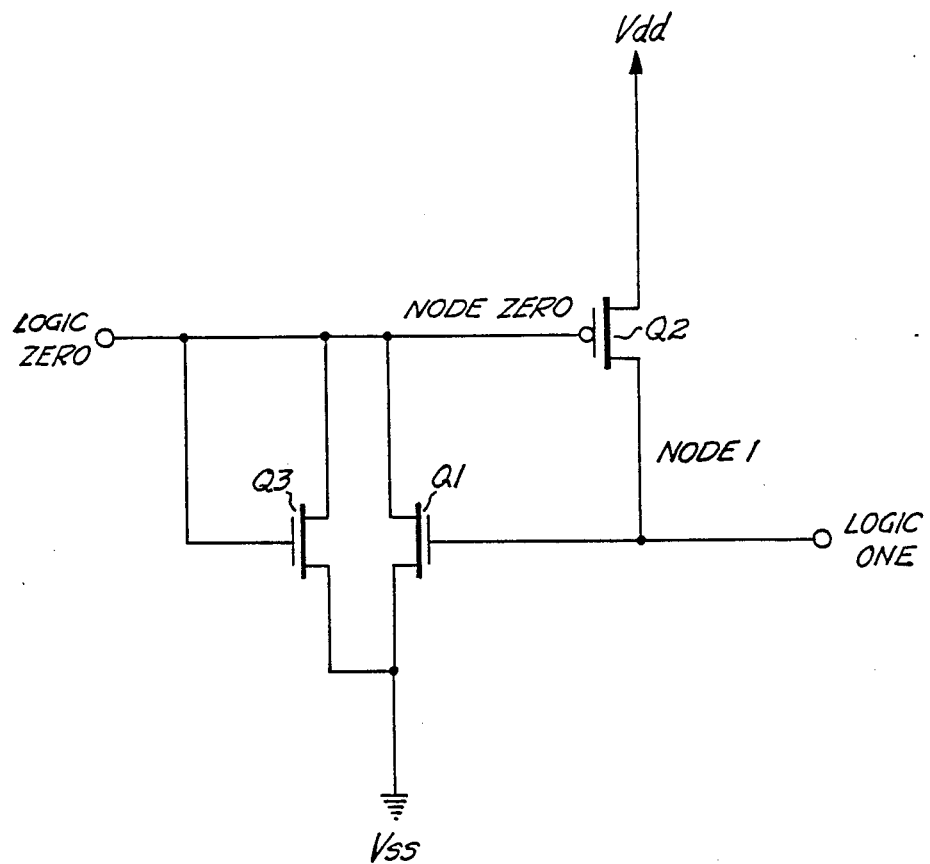

SAFE LOGIC ZERO AND ONE SUPPLY FOR CMOS INTEGRATED CIRCUITS

BACKGROUND OF THE INVENTION

1. Field of the Invention

The present invention generally relates to digital logic power supply circuits and, more particularly, to a simple circuit than can be used in complementary metal oxide semiconductor (CMOS) integrated circuits (ICs) to supply safe logic zero and logic one signals to hardwired inputs.

2. Description of the Prior Art

In a CMOS IC, it is dangerous to connect a power line, either drain voltage $V_{dd}$ or source voltage $V_{ss}$, to the gate of a positive channel metal oxide silicon (PMOS) or negative channel metal oxide silicon (NMOS) field effect transistor FET). This is because the gate of the transistor is more vulnerable to noise than either the drain or source of the transistor. A noise spike on the gate can break down the gate oxide, causing permanent failure of the device. This leads to a long term reliability problem, especially in noisy environments. The $V_{dd}$ and $V_{ss}$ lines can be particularly noisy because they have no noise protection at the pads where they are brought into the IC, and because they tend to pick up noise from the environment outside the IC.

It is typical in digital CMOS circuits to assign the voltages $V_{dd}$ and $V_{ss}$ to the logic values logic one and logic zero, respectively. Without loss of generality, it will be assumed in the discussion which follows that this convention is followed; that is, voltage $V_{dd}$ is assigned to logic one and voltage $V_{ss}$ is assigned to logic zero.

In many cases, it is necessary to hardwire a circuit input to either logic zero or logic one. This is especially true in very large-scale integrated (VLSI) circuit designs, where a standard module may be used several times in places where its full functionality is not required and some of its inputs require constant logic values. If these hardwired connections are made directly to the $V_{dd}$ or $V_{ss}$ lines, it is a difficult and awkward design constraint to ensure that no transistor gate is connected to voltages $V_{dd}$ or $V_{ss}$. It is simpler to provide safe logic zero and logic one level signals which can be used for hardwired inputs.

In most CMOS circuit designs, the reliability problem caused by connecting hardwired inputs to voltages $V_{dd}$ or $V_{ss}$ has not been considered. Where there has been an effort to isolate logic zero and logic one signals from the $V_{dd}$ and $V_{ss}$ lines, the circuit used to supply these signals is itself often vulnerable to noise on the $V_{dd}$ or $V_{ss}$ lines, as there is a transistor gate connected to one of these lines. Moreover, these circuits are typically quite complex, taking up valuable area on the IC.

SUMMARY OF THE INVENTION

It is therefore an object of the present invention to provide a simple and safe circuit that can be used in CMOS ICs to supply logic zero and logic one signals to hardwired logical inputs.

It is a further object of the invention to provide a safe logic zero and logic one supply for CMOS ICs that exhibits good current source and sink capability.

According to the invention, the circuit comprises at most three transistors, none of which has a gate connected to either of voltages $V_{dd}$ and $V_{ss}$. The circuit has no inputs, and has two outputs, i.e., logic zero and logic one. The circuit has only one stable operating point and moves to this operating point from any initial condition. The circuit is safe as it provides exactly the same noise protection from voltages $V_{ss}$ and $V_{dd}$ for nodes connected to its output as an inverter provides to nodes connected to its output.

BRIEF DESCRIPTION OF THE DRAWING

The foregoing and other objects, aspects and advantages of the invention will be better understood from the following detailed description of a preferred embodiment of the invention with reference to the drawing, in which the single FIGURE is a schematic circuit diagram of the safe logic zero, logic one supply circuit for CMOS ICs according to the invention.

DETAILED DESCRIPTION OF A PREFERRED EMBODIMENT OF THE INVENTION

Referring now to the drawing, there is shown a first NMOS FET $Q_1$ having its drain electrode connected to Node Zero, its gate electrode connected to Node One, and its source electrode connected to a relatively negative voltage $V_{ss}$. A second PMOS FET $Q_2$ has its Source electrode connected to a relatively positive voltage $V_{dd}$, its gate electrode connected to Node Zero, and its drain electrode connected to Node One. Thus the gate electrode of transistor $Q_2$ is connected to the drain electrode of transistor $Q_1$ and the drain electrode of transistor $Q_2$ is connected to the gate electrode of transistor $Q_1$. In addition to the first and second FETs $Q_1$ and $Q_2$, there is, optionally, a third NMOS FET $Q_3$ having its source and drain electrodes connected in common with the source and drain electrodes, respectively of FET $Q_1$ and having its gate electrode connected to Node Zero. Node Zero is, in turn, connected to a Logic Zero terminal, and Node One is connected to a Logic One terminal. These are the terminals to which hardwired connections for logic zero and logic one signals are made.

To understand the operation of the circuit, first consider the circuit as comprising transistors $Q_1$ and $Q_2$ only. If transistor $Q_1$ is turned on at all, it will pull charge out of Node Zero. As Node Zero drops in voltage, transistor $Q_2$ will turn on. This will raise the voltage at Node One, which turns transistors $Q_1$ on harder. Thus a positive feedback loop is set up which drives the circuit to its stable operating point; i.e., when Node Zero is at $V_{ss}$ volts and Node One is at $V_{dd}$ volts. Transistors $Q_1$ and $Q_2$ should be large enough to handle the dynamic switching load of all input signals supplied to them. If all of the inputs are high impedance nodes (i.e., gates of transistors), then transistors $Q_1$ and $Q_2$ need not be large at all to supply a safe logic zero and logic one signal to an entire integrated circuit.

Transistor $Q_3$ is included in the circuit to help start the circuit toward its stable operating point in the worst case start up condition where Node Zero is at $V_{dd}$ volts and Node One is at $V_{ss}$ volts. In this case, transistors $Q_1$ and $Q_2$ will be in the off condition, and no currents will flow through them except for very small leakage currents. However, transistor $Q_3$ will be turned on, pulling Node Zero down enough to begin to turn transistor $Q_2$ on. After the stable point is reached, transistor $Q_3$ is turned off and can be considered to be out of the circuit. Transistor $Q_3$ is not entirely necessary, because the leakage currents are large enough to initiate the feedback condition, but it is included as being good design practice and to ensure that the circuit can be more easily simulated by switch level or circuit level simulators.

The circuit according to the invention is as safe to use as an inverter. Any spikes on voltages $V_{dd}$ or $V_{ss}$ are filtered by the turn-on resistance of the PMOS transistor $Q_2$ or the NMOS transistor $Q_1$, which is on the order of hundreds of ohms in both transistors, and the load capacitance of the widely distributed logic zero or logic one output lines. Thus it will be apreciated that the circuit according to the invention provides a simple and safe circuit to supply logic zero and logic one signals to CMOS ICs.

While the invention has been described in terms of a single preferred embodiment, those skilled in the art will recognize that the invention can be practiced with modification within the spirit and scope of the appended claims. In particular, transistor $Q_3$ could be replaced by a PMOS transistor with a gate at Node One, a drain at Node One and a source at voltage $V_{dd}$. It is, therefore, to be understood that the appended claims are intended to cover all such modifications and changes as fall within the true spirit of the invention.

Having thus described my invention, what I claim as new and desire to secure by Letters Patent is as follows:

1. A safe logic zero and logic one supply for CMOS integrated circuits comprising:
    a source of positive voltage and a source of negative voltage;
    a logic zero output terminal and a logic one output terminal;
    a complementary pair of MOSFET devices connected to provide positive feedback to one another when conducting, said complementary pair of MOSFET devices being connected between said source of positive voltage and said source of negative voltage and having respective gate electrodes connected to said logic zero output terminal and to said logic one output terminal, said logic zero output terminal being at a voltage approximately equal to said negative voltage and said logic one output terminal being at a voltage approximately equal to said positive voltage when said MOSFET devices are conducting; and
    means for insuring the conduction of at least one of said MOSFET devices and connected to a conducting MOSFET device and said complementary pair, thereby causing both fo said MOSFET devices to conduct due to said positive feedback.

2. The circuit according to claim 1 wherein said pair of complementary MOSFET devices comprises:
    a first NMOS transistor having its gate electrode connected to said logic one output terminal, said NMOS transistor having a source electrode connected to said negative voltage source and a drain electrode connected to said logic zero output terminal; and
    a PMOS transistor having its gate electrode connected to said logic zero output terminal, said PMOS transistor having a source electrode connected to said positive voltage source and a drain electrode connected to said logic one output terminal.

3. The circuit recited in claim 2 further comprising a second NMOS transistor having gate, source and drain electrodes, said gate electrode of said second NMOS transistor being connected to said logic zero output terminal and said source and drain electrodes of said second NMOS transistor being connected respectively to said source and drain electrodes of said first NMOS transistor.

4. A safe logic zero and logic one supply for CMOS integrated circuits comprising:
    a logic zero output terminal and a logic one output terminal;
    a complementary pair of MOSFET devices connected to provide positive feedback to one another when conducting, said complementary pair of MOSFET devices being adapted to be coupled between a source of positive voltage and a source of negative voltage and having respective gate electrodes connected to said logic zero output terminal and to said logic one output terminal, said logic zero output terminal being at a voltage approximately equal to said negative voltage and said logic one output terminal being at a voltage approximately equal to said positive voltage when said MOSFET devices are conducting; and
    means for insuring conduction of at least one of said MOSFET devices and connected to a conducting MOSFET device of said complementary pair, so as to cause both of said MOSFET devices to conduct due to said positive feedback.

5. The circuit according to claim 4 wherein said pair of complementary MOSFET devices comprises:
    a first NMOS transistor having its gate electrode coupled to said logic one output terminal, said NMOS transistor having a source electrode adapted to be coupled to said negative voltage source and a drain electrode coupled to said logic zero output terminal; and
    a PMOS transistor having its gate electrode coupled to said logic zero output terminal, said PMOS transistor having a source electrode adapted to be coupled to said positive voltage source and a drain electrode coupled to said logic one output terminal.

6. The circuit recited in claim 5 further comprising a second NMOS transistor having gate, source and drain electrodes, said gate electrode of said second NMOS transistor being coupled to said logic zero output terminal and said source and drain electrode of said NMOS transistor being connected respectively to said source and drain electrodes of said first NMOS transistor.

* * * * *